(12) United States Patent
Rapp (10) Patent No.: US 9,077,294 B2
(45) Date of Patent: Jul. 7, 2015

(54) MEASUREMENT OF THE OUTPUT CURRENT OF AN AMPLIFIER CIRCUIT

(71) Applicant: Astrium GmbH, Taufkirchen (DE)

(72) Inventor: Udo Rapp, Markdorf (DE)

(73) Assignee: Astrium GmbH, Taufkirchen (DE)

( * ) Notice: Subject to any disclaimer, the term of this patent is extended or adjusted under 35 U.S.C. 154(b) by 115 days.

(21) Appl. No.: 13/648,342

(22) Filed: Oct. 10, 2012

(65) Prior Publication Data

US 2013/0088290 A1    Apr. 11, 2013

(30) Foreign Application Priority Data

Oct. 11, 2011   (DE) .......................... 10 2011 115 503

(51) Int. Cl.
    *H03F 3/45*    (2006.01)
    *H03F 3/217*   (2006.01)
(52) U.S. Cl.
    CPC . *H03F 3/217* (2013.01); *H03F 3/45* (2013.01)
(58) Field of Classification Search
    CPC ....................................................... H03F 3/217
    USPC .............................. 330/10, 251, 207 A, 207 P
    See application file for complete search history.

(56) References Cited

U.S. PATENT DOCUMENTS

| | | | |
|---|---|---|---|
| 6,597,240 B1 | 7/2003 | Walburger et al. | |
| 6,952,131 B2 * | 10/2005 | Jeong et al. | 330/10 |
| 7,368,986 B2 * | 5/2008 | Pillonnet | 330/10 |
| 7,372,238 B1 | 5/2008 | Tomiyoshi | |
| 7,646,240 B2 * | 1/2010 | Sutardja | 330/207 A |
| 7,961,484 B2 | 6/2011 | Lalithambika et al. | |
| 2004/0000895 A1 | 1/2004 | Solivan | |
| 2004/0056644 A1 | 3/2004 | Wang | |
| 2010/0060257 A1 | 3/2010 | Azrai et al. | |
| 2011/0050185 A1 | 3/2011 | Notman et al. | |

OTHER PUBLICATIONS

Kagerbauer J D et al., "Development of an Active dv/dt Control Algorithm for Reducing Inverter Conducted EMI with Minimal Impact on Switching Losses", Power Electronics Specialists Conference, IEEE, Piscataway NJ, USA, Jun. 17, 2007, pp. 894-900 XP031218403.
European Search Report dated Feb. 8, 2013 w/partial English translation (six (6) pages).

* cited by examiner

*Primary Examiner* — Robert Pascal
*Assistant Examiner* — Khiem Nguyen
(74) *Attorney, Agent, or Firm* — Crowell & Moring LLP (57) ABSTRACT

An amplifier circuit includes a first and a second switching element connected in series between a first and a second voltage potential and are actuated in the amplifier mode in a clocked manner. A capacitive element is connected in parallel to at least one of the two switching elements, a measuring circuit for measuring the switching edges occurring during switching of the switching elements, and a current-determining circuit for determining the output current by means of the measured switching edges.

13 Claims, 6 Drawing Sheets

MEASUREMENT OF THE OUTPUT CURRENT OF AN AMPLIFIER CIRCUIT

CROSS-REFERENCE TO RELATED APPLICATIONS

The present application claims priority under 35 U.S.C. §119 to German Application No. 10 2011 115 503.5, filed Oct. 11, 2011, the entire disclosure of which is herein expressly incorporated by reference.

BACKGROUND AND SUMMARY OF THE INVENTION

Clocked class D amplifiers can be used for supplying power to electrical drives. Such amplifiers are usually actuated by means of pulse-width modulation (PWM) and in most cases provide electric output current via an LC filter for supplying an electrical drive. The advantages of clocked class D amplifiers are primarily their high efficiency and low heat losses.

Measuring the output current, for example, for regulating or controlling an electrical drive can be carried through a shunt resistor or a transformer with a subsequent analog controller. Such circuit concepts, however, have very little flexibility because they have to be adapted to particular measuring ranges. For example, a shunt resistor has to be selected corresponding to the current range to be measured. In addition, the circuit concepts result in high circuit and adjustment complexity.

Instead of an analog controller it is also possible to use an analog-to-digital converter which can measure the current channels of a plurality of amplifiers, for example, via a multiplexer. However, such a concept causes also high circuit complexity, which is disadvantageous in certain fields of application such as, for example, in the aerospace sector, because here, only a small number of qualified components are available.

Exemplary embodiments of the present invention are directed to an amplifier circuit that enables measuring the output current thereof with a circuit complexity as low as possible.

An idea underlying the invention is to measure the switching edges occurring during switching of switching elements of an output stage of an amplifier circuit, in particular of a class D amplifier, and to determine the output current of the amplifier circuit based on these measurements. In order to minimize tolerance influences of the switching elements, which can be implemented through transistors, a capacitive element, in particular a capacitor, can be connected in parallel to at least one of the switching elements. Since the switching edge of a real switching element, such as a transistor, changes its steepness depending on the output stage current or output current (to be measured), the output current can be derived from the measurement of the switching edge. A switching edge can, in particular, be determined by measuring a delay time of a rising or falling voltage edge. For implementing the amplifier circuit according to the invention, no components are required that are critical in particular fields of application such as the aerospace sector, such as analog-to-digital converters and multiplexers.

One embodiment of the invention relates to an amplifier circuit, comprising a first and a second switching element that are connected in parallel series between a first and a second voltage potential and are actuated in a clocked manner in amplifier mode, wherein a capacitive element is connected in parallel to at least one of the two switching elements, a measuring circuit for measuring the switching edges occurring during switching of the switching elements, and a current-determining circuit for determining the output current by means of the measured switching edges.

The at least one capacitive element connected in parallel can be implemented through a separate capacitor that is configured such that switching edges occurring during switching of the switching elements fall or rise almost linearly with a measurable slope. In particular, the at least one capacitive element is selected such that tolerance influences of the switching elements are reduced to such an extent that their influence on measurements is negligibly low.

The measuring circuit can comprise a time-to-digital converter for measuring a time period of a change of the voltage at the midpoint of the series connection of the two switching elements, which said change occurs during switching of at least one of the two switching elements. A time-to-digital converter enables highly accurate time interval measurements, as a result of which also relatively steeply falling voltage edges can result in time measurements usable for the purposes of the present invention.

The measuring circuit can be configured to generate a start signal for the measuring process carried out by the time-to-digital-converter when the voltage at the midpoint of the series connection of the two switching elements exceeds or falls below a first threshold voltage, and to generate a stop signal for the measuring process carried out by the time-to-digital-converter when the voltage at the midpoint of the series connection of the two switching elements exceeds or falls below a second threshold voltage. Through this, the switching edge of the voltage at the midpoint of the series connection of the two switching elements can be measured over a given voltage range so that possible measuring errors caused, for example, by fluctuating supply voltage can be largely eliminated. For example, in the case of a supply voltage of +25 Volt to −25 Volt, a measuring range between +5 Volt and −5 Volt can be defined through the first and second threshold voltages so that fluctuations of the supply voltage have virtually no measurable influence on the measurements.

It is possible that the first and second threshold values are selected to be almost identical so that only one threshold exists for generating the start and stop signals for the measuring process carried out by the time-to-digital converter, which can result in a slightly reduced accuracy, but is simpler to implement for circuit-related reasons. In particular, the two identical threshold voltages can be selected such that they lie approximately in the middle of the supply voltage range of the amplifier circuit.

The measuring circuit can comprise one or a plurality of comparators for detecting when the voltage at the midpoint of the series connection of the two switching elements exceeds or falls below the first and/or the second threshold voltage, and for generating the start and/or stop signal for the time-to-digital converter. Comparators have the advantage that they are also available for critical fields of application of the amplifier circuit, such as the aerospace sector with its particular specifications. For each threshold value, a separate comparator can be provided. If the first and second threshold values are selected to be identical, a single comparator is sufficient resulting in lower circuit-related complexity when implementing the amplifier circuit.

The time-to-digital converter can be implemented through a programmable module, in particular a FPGA (Field Programmable Gate Array), an ASIC (Application Specific Integrated Circuit) or a special time-to-digital converter module.

The current-determining circuit can be configured to determine the output current by means of the measured switching edges, in particular by means of the measured time period of the change of the voltage at the midpoint of the series connection of the two switching elements, which change occurs during switching of at least one of the two switching elements, and by means of the known value of the at least one capacitive element. For example, with the known value of the at least one capacitive element, the time constant, the voltage range defined by the threshold voltages and the measured time period, the current-determining circuit can determine the charging/discharge current of the at least one capacitive element, which corresponds to the output current of the amplifier circuit.

Furthermore, the current-determining circuit can be configured to determine, based on the time period measured for a positive switching edge and based on the time period measured for a negative switching edge, a positive or negative output current, respectively.

The current-determining circuit can also be configured to determine the difference between the time period measured for a positive switching edge and the time period measured for a negative switching edge and, based on the determined difference, to carry out a calibration of the measured switching edges. This enables in particular a precise calibration and results in an almost linear time-to-current curve over a wide range.

The current-determining circuit can further be configured to consider calibration values when determining the output current by means of the measured switching edges, which calibration values have been determined under known operating conditions of the amplifier circuit, in particular in a clocked amplifier mode with a predefined duty cycle such as, for example, 50:50 for generating a known output current.

The first and second voltage potentials can be approximately identical with regard to the absolute value and can have different polarities. In this case, a zero-crossing occurs during a switching process, which said zero-crossing can be reliably determined by a comparator for a rising and also a falling switching edge, and can be used for the measurement.

The first switching element can be a P-channel MOSFET (Metal Oxide Semiconductor Field Effect Transistor), and the second switching element can be an N-channel MOSFET.

The amplifier circuit according to the invention can be part of a class D amplifier circuit, and the first and second switching elements can be actuated with a pulse-width-modulated signal.

Furthermore, the at least one capacitive element can comprise an attenuator for limiting current, wherein the attenuator comprises in particular a parallel connection of a diode and a resistor and is connected between a connection of the capacitive element and a connection of one of the switching elements. The attenuator can avoid damage to the at least one capacitive element caused by high currents which can occur during closing of the switching element thereby effecting short-circuiting the capacitive element.

Further advantages and possible usages of the present invention arise from the following description in connection with the exemplary embodiments illustrated in the drawings.

BRIEF DESCRIPTION OF THE DRAWING FIGURES

In the description, in the claims, in the abstract and in the drawings, the terms and associated reference numbers used in the reference list below are used.

In the figures.

In the following description, identical, functional identical and functionally connected elements can be designated with identical reference numbers. Absolute values are given hereinafter only as an example and are not to be understood as limiting the invention.

DETAILED DESCRIPTION

Figure 1:
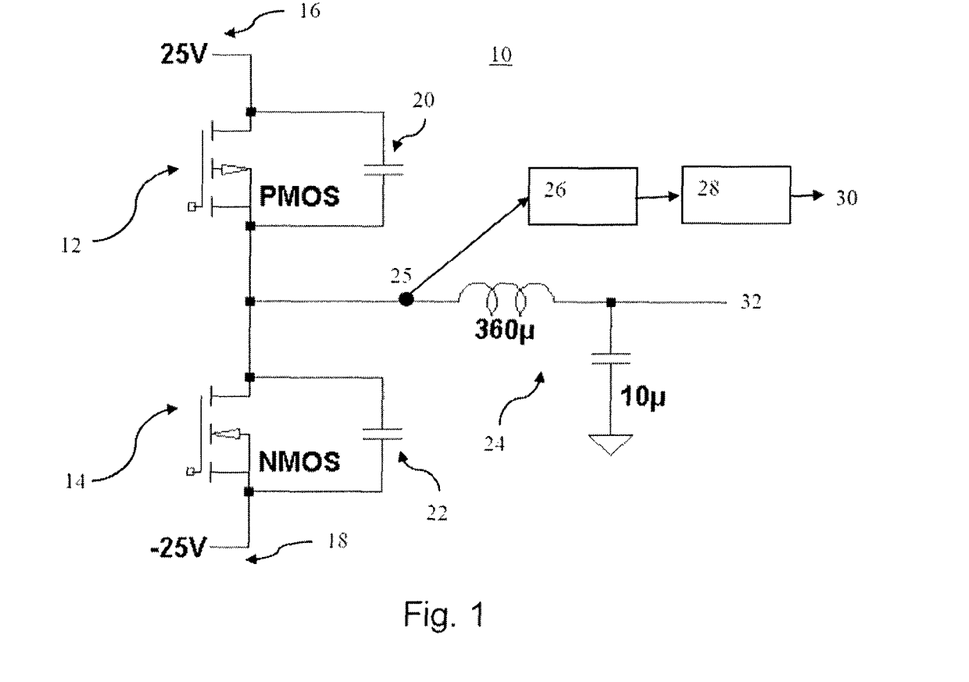
FIG. 1 shows a circuit diagram of an exemplary embodiment of an amplifier circuit according to the invention.

FIG. 1 shows a class D amplifier circuit 10 for actuating an electric drive, for example, an electric motor. The amplifier circuit 10 comprises a P-channel MOSFET (PMOS) 12 as a first switching element and an N-channel MOSFET (NMOS) 14 as a second switching element. The two MOSFETs 12 and 14 are connected in series between a first positive potential 16, for example +25 Volt, and a second negative potential 18, for example −25 Volt. Connected in parallel to the channels of the two MOSFETs 12 and 14 are in each case a first and a second capacitor 20 and 22, respectively, as a capacitive element for minimizing tolerance influences of the MOSFETs on the switching of the voltage at the midpoint of the series connection of the two MOSFETs 12 and 14.

An LC low-pass filter 24 comprising an inductor 360µ and a capacitor 10µ is connected on the input side to the midpoint of the series connection of the two MOSFETs 12 and 14. The filter 24 causes the output current of the amplifier circuit 10 at the amplifier output 32 to be largely constant in clocked operation, in particular during a switching phase. In terms of the circuit, the LC low-pass filter 24 is principally not required for implementing the present invention. Instead of the LC low-pass filter 24, it is also possible to provide a single inductance such as an inductor or an inductive load such as an electric motor.

The input voltage 25 at the LC low-pass filter 24, which corresponds to the voltage at the midpoint of the series connection of the two MOSFETs 12 and 14, is fed to a measuring circuit 26, downstream of which a current-determining circuit 28 is connected for determining and outputting the measured value 30 of the output current of the amplifier circuit 10.

Figure 2:
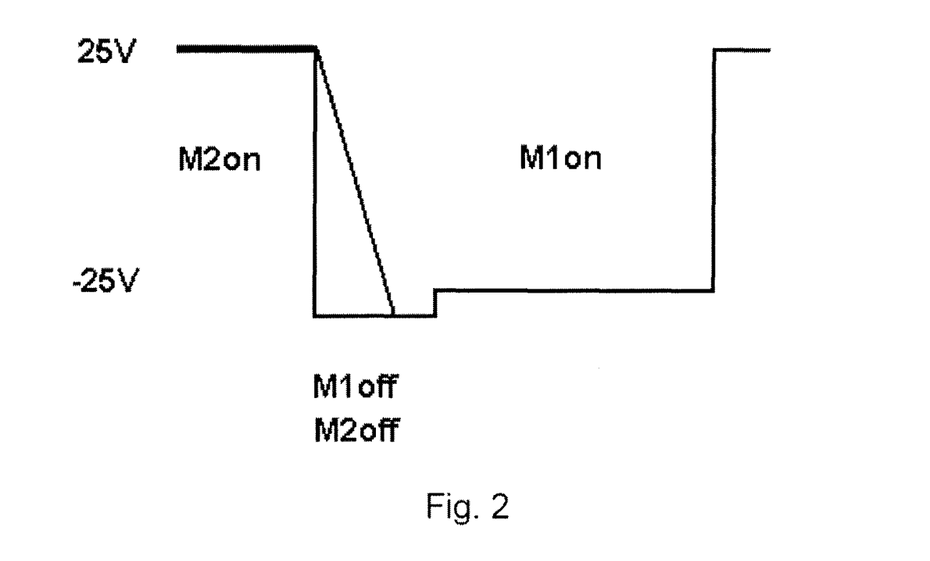
FIG. 2 shows an exemplary curve of the input voltage at the LC filter of the amplifier circuit shown in FIG. 1.

The two MOSFETs 12 and 14 are operated with a PWM signal in a clocked manner. During the dead time when switching the two MOSFETs 12 and 14, the capacitors 20 and 22, which are connected in parallel to the said MOSFETs, are reverse charged by the output current which is largely constant due to the LC low-pass filter 24. This results in an almost linearly falling or rising voltage edge of the input voltage 25 of the LC low-pass filter 24, as illustrated by means of the exemplary curve of the input voltage 25 at the LC low-pass filter 24 for different switching phases of the amplifier circuit 10. In the diagram of FIG. 2, the P-channel MOSFET 12 is designated with M2 and the N-channel MOSFET 14 is designated with M1. The ideally progressing input voltage 25 is illustrated with infinitely steep edges and ranges between the positive and the negative potential of approximately +25 Volt and −25 Volt. The edge of the input voltage 25, which edge falls linearly caused by the capacitors 20 and 22 when switching the MOSFETS 12 and 14, is shown as a diagonal edge. The slope of this diagonal edge is directly proportional to the output current of the amplifier circuit 10.

Figure 3A:
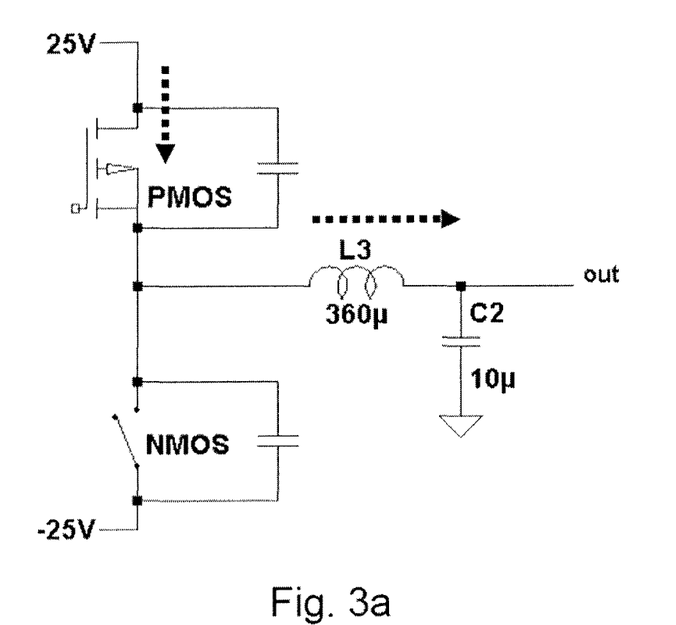
FIGS. 3a, 3b, and 3c shows the current paths during different clock phases or switching phases of the amplifier circuit shown in FIG. 1.
Figure 3B:
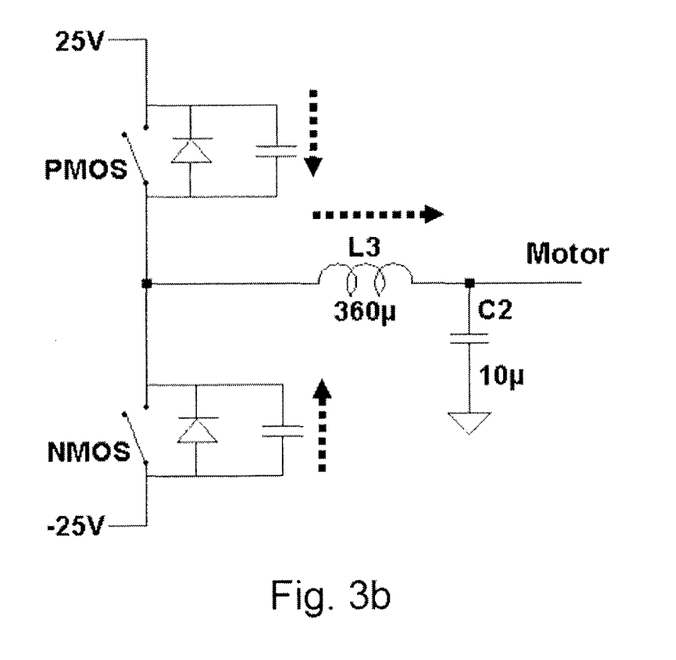
Figure 3C:
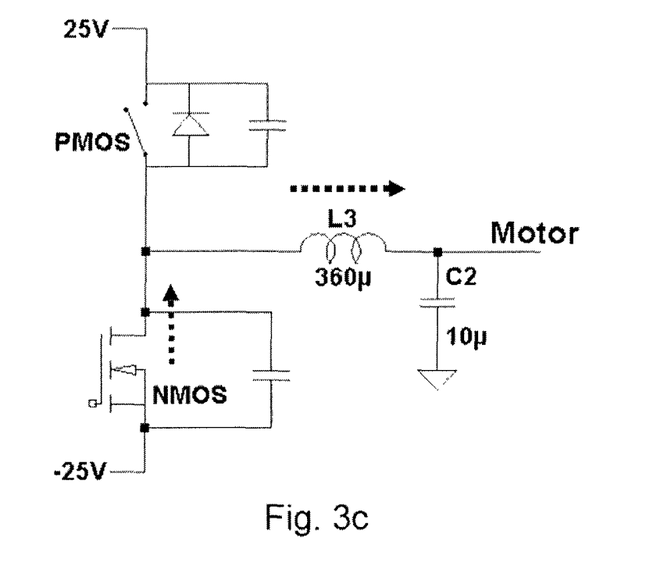

The switching processes and the current paths occurring at the same time are shown in FIGS. 3a-3c.

FIG. 3a illustrates a switching phase in which the channel of the P-channel MOSFET PMOS is open and the channel of the N-channel MOSFET NMOS is blocked. Thus, the positive potential +25V (Volt) is applied as input voltage to the input of the LC low-pass filter, and the current flow illustrated by the dotted arrows in bold runs from the positive potential +25V via the inductor L3 of the LV low-pass filter to the amplifier output "out".

In FIG. 3b, the channels of both MOSFETs PMOS and NMOS are blocked, as indicated by the open switches. In this case, the MOSFETs PMOS and NMOS act like the indicated diodes, and the electric charge stored in the capacitors connected in parallel to MOSFETs flows as current (indicated by the dotted arrows in bold) via the inductor L3 of the LC low-pass filter to the amplifier output into an electric motor connected thereto.

Finally, FIG. 3 illustrates a switching phase in which the channel of the N-channel MOSFET NMOS is open and the channel of the P-channel MOSFET PMOS is blocked. Thus, the negative potential −25V (Volt) is applied as input voltage to the input of the LC low-pass filter, and the current flow illustrated by the dotted arrows in bold runs from the negative potential −25V via the inductor L3 of the LC low-pass filter to the amplifier output "out" into the electric motor connected thereto.

In the following, it is explained with reference to the exemplary embodiments of the measuring circuit and the current-determining circuit according to the invention shown in the FIGS. 4 and 5 how the switching edges occurring during switching of the switching elements can be measured, and how the output current can be determined therefrom.

Figure 4:
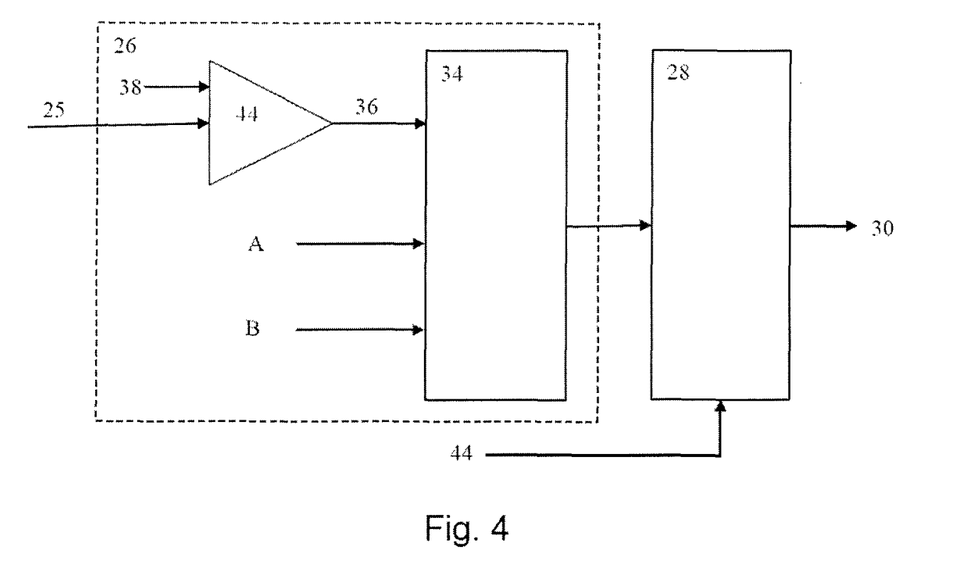
FIG. 4 shows a block diagram of a first exemplary embodiment of the measuring circuit and the current-determining circuit according to the invention.

In the exemplary embodiment shown in FIG. 4, the measuring circuit 26 has a single comparator 44 that compares the input voltage 25 of the LV low-pass filter 24 with a threshold voltage 38 that is selected such that it lies approximately in the middle between the first positive and the second negative potential 16 and 18, respectively, thus approximately at 0 Volt. Accordingly, the comparator 44 detects a zero-crossing of the input voltage 25. The digital signal 36 generated by the comparator 44 changes its status during a zero-crossing, for example, when the input voltage 25 decreases (falling or negative switching edge) and falls below the threshold voltage 38, or when the input voltage 25 increases (rising or positive switching edge) and exceeds the threshold voltage 38.

The digital output signal 36 of the comparator 44 is fed together with the switching signals A and B of the MOSFETs 12 and 14 to a time-to-digital converter 34 for measuring short time intervals. The time-to-digital converter 34 starts a measurement of a short time interval when the switching status of one of the switching signals A or B changes and both switching signals A and B have such a status that both MOSFETs 12 and 14 are blocked (see FIG. 3b), and stops this measurement when the switching status of the digital signal 36 changes. The value of the time interval defined by the changes of the signal status and measured by the time-to-digital converter 34 is output as a digital measured value of the time interval to the current-determining circuit 28 which determines the output current from said value.

The exact operating mode of the measuring circuit 26 and the current-determining circuit 28 shown in FIG. 4 is now explained by means of the exemplary curve of the input voltage 25 shown in FIG. 2.

Initially, the amplifier circuit is in the status shown in FIG. 3a in which the NMOS 14 is switched off. In a switching phase, the PMOS 12 is also switched off (FIG. 3b), i.e., the switching signal A changes its status at a time tA, as a result of which the time-to-digital converter 34 begins with the measurement of a short time interval. As shown in FIG. 2, the input voltage 25 now falls from +25 Volt to −25 Volt, wherein the capacitors 20 and 22 connected in parallel to the MOSFETs cause a delay of the voltage drop, as indicated by the sloping line in FIG. 2.

The comparator 44 compares the falling input voltage 25 with the threshold voltage of, for example, 0 Volt and changes the status of the output signal 36, for example, from binary 0 to 1 at the time tK1 as soon as the input voltage 25 falls below the threshold value 38, as a result of which the measurement is terminated by the converter 34 and the digital measured value of the time interval T1=tA−K1 is output to the current-determining circuit 28.

The measuring circuit 26 shows a similar operating mode when the amplifier circuit changes from the status shown in FIG. 3c, in which the PMOS 12 is switched off, to the status shown in FIG. 3b, thus, when the NMOS 14 is switched off, i.e., the switching signal B changes its status at the time tB. Through this, the time-to-digital converter 34 is triggered so as to start with the measurement of a short time interval. The input voltage 25 now increases from −25 Volt to +25 Volt, wherein the capacitors 20 and 22 connected in parallel to the MOSFETs cause again a delay of the voltage rise. The comparator 44 compares the falling input voltage 25 with the threshold voltage of, for example, 0 Volt and changes the status of the output signal 36, for example, from binary 0 to 1 at the time tK2 as soon as the input voltage 25 exceeds the threshold value 38, as a result of which the measurement is terminated by the converter 34 and the digital measured value of the time interval T2=tB−tK2 is output to the current-determining circuit 28.

Figure 6:
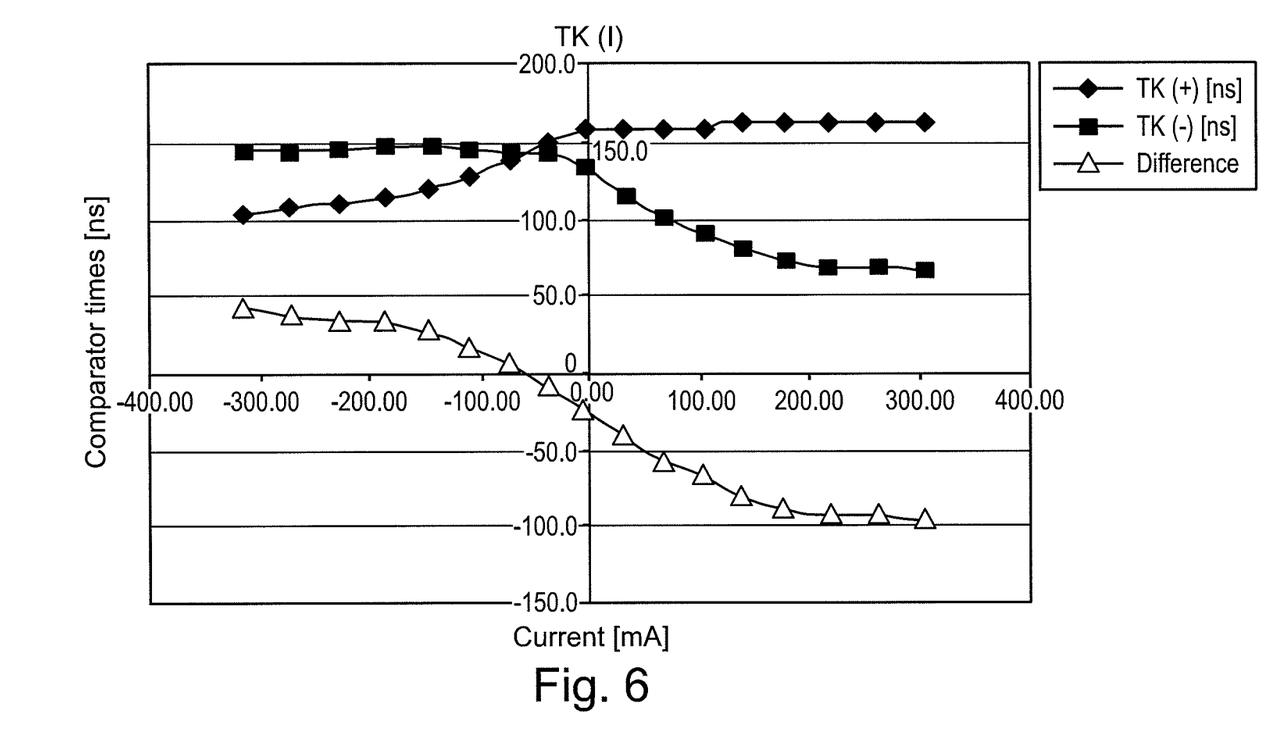
FIG. 6 shows a diagram with measured comparator times at different currents.

The dependency of the comparator measuring times (times, at which the output signal 36 of the comparator 44 changes because the input voltage 25 exceeds or falls below the threshold voltage) on the currents to be determined is shown exemplary in the diagram shown in FIG. 6. The electrical currents are plotted along the abscissa, and the measured comparator time TK(I), which depends on the current, is plotted along the ordinate. The measurement graph designated with TK(+) shows the comparator times with the switching edge rising and the measurement graph designated with TK(−) shows the comparator times with the switching edge falling. With the switching edge rising, the dependency of the comparator time on current in the case of negative currents is almost linear. In contrast, with a falling switching edge, the dependency of the comparator time on current in the case of positive currents is almost linear. Thus, through a difference of the measured comparator times at rising and falling switching edges, an almost linear dependency can be achieved over the entire current range, as shown in the diagram by the curve designated with "difference". The offset values of the measurement graphs designated with TK(+) and TK(−) result from the unavoidable delay time between the status change of a switching signal of one of the MOSFETs 12 and 14 and the actual switch-off of the MOSFET 12 or 14. By forming the difference, this offset can be compensated, although not completely.

By means of the digital measured value of the time interval T1 or T2, the known values of the two capacitors 20 and 22 and by means of the known physical correlations when charging and discharging capacitors, the current-determining circuit 28 determines now the output current of the amplifier circuit 10. For example, with a falling switching edge of the input voltage 25 (Uinput) and a supply voltage Vcc, the current-determining circuit 28 can determine the current J0 in the capacitor according to the following equation:

$$U\text{input}=Vcc-I0/C*t,$$

wherein C represents the capacitance of the first capacitor 20. A measured time interval T0 can be used for the parameter t. It follows from the above equation that T0 is proportional to 140. However, the reciprocal function 1/x can be approximated through a linear function so that a linear correlation between the measured time interval T0 and the current J0 can be established, which said correlation can be used by the current-determining circuit 28 for determining the current when capacitance of the first and second capacitors 20 or 22 is known and supply voltage Vcc and input voltage Uinput are known.

Furthermore, when determining the output current, the current-determining circuit 28 can consider calibration values 44 that were determined through calibration measurements. These calibration measurements can be carried out under known conditions, for example, with a precisely specified duty cycle in a clocked amplifier mode, for example, a duty cycle of 50:50 for generating a known and precisely defined output current. The calibration measurements and the calibration values determined therewith serve primarily for minimizing error influences caused by, for example, component tolerances, temperature effects or external influences such as, for example, the supply voltage of the amplifier circuit.

Figure 5:
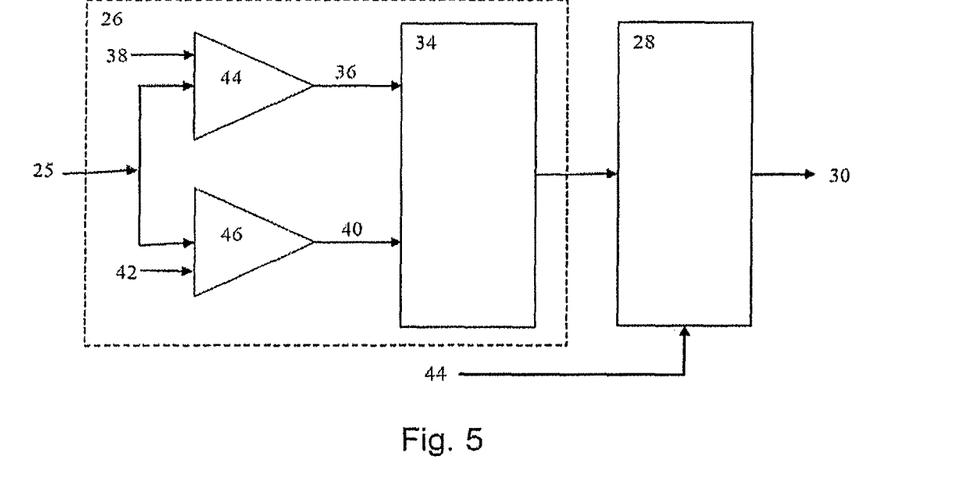
FIG. 5 shows a block diagram of a second exemplary embodiment of the measuring circuit and the current-determining circuit according to the invention.

Instead of a single comparator, the measuring circuit 26 in the exemplary embodiment shown in FIG. 5 comprises a first comparator 44 and a second comparator 46 that compare the input voltage 25 of the LC low-pass filter 24 with a first threshold voltage 38 or a second threshold voltage 42. The first threshold voltage 38 can be, for example, +5 Volt and the second threshold voltage 42 can be −5 Volt. As an alternative, the first threshold voltage 38 can also be 0 Volt so that a zero-crossing of the input voltage 25 is detected, and the second threshold voltage 42 can be +25 Volt (measurement rising edge) or −25 Volt (measurement falling edge).

The first comparator 44 generates a digital signal 36 for a time measurement, and the second comparator 46 generates a digital stop signal 40. Both signals 36 and 40 are fed to a time-to-digital converter 34 for measuring short time intervals. The time-to-digital converter 34 starts a measurement of a short time interval when the switching status of the digital start signal 36 changes, and it stops this measurement when the switching status of the digital stop signal 40 changes. The value of the time interval defined by the changes of the signal status of the start and stop signal and measured by the time-to-digital converter 34 is output as a digital measured time interval value to the current-determining circuit 28, which determines the output current from said value.

The exact operating mode of the measurement circuit 26 and the current-determining circuit 28 shown in FIG. 5 is now explained by means of the exemplary curve of the input voltage 25 shown in FIG. 2.

Initially, the amplifier circuit is in the status shown in FIG. 3a in which the NMOS 14 is switched off. In a switching phase, the PMOS 12 is also switched off (FIG. 3b). As a result of this, the input voltage 25 falls from +25 Volt to −25 Volt, as shown in FIG. 2, wherein the capacitors 20 and 22 connected in parallel to the MOSFETs cause a delay of the voltage drop, as indicated by the sloping line in FIG. 2.

The first comparator 44 compares the falling input voltage 25 with the first threshold voltage of, for example, +5 Volt (or 0 Volt) and changes the status of the start signal 36, for example, from binary 0 to 1 as soon as the input voltage 25 falls below the first threshold value 38. The status change of the start signal 36 causes the time-to-digital converter 34 to start with the measurement of a short time interval. If the continuously falling input voltage 25 falls also below the second threshold value 42 of, for example, −5 Volt (or −25 Volt), the second comparator 46 changes the status of the stop signal 40, for example, from binary 0 to 1, as a result of which the measurement is terminated by the time-to-digital converter 34 and the digital measured value of the time interval is output to the current-determining circuit 28.

By means of the digital measured value of the time interval T1 or T2, the known values of the two capacitors 20 and 22 and by means of the known physical correlations when charging and discharging capacitors, the current-determining circuit 28 determines now the output current of the amplifier circuit 10. Furthermore, when determining the output current, the current-determining circuit 28 can consider calibration values 44 that were determined through calibration measurements. These calibration measurements can be carried out under known conditions, for example, with a precisely specified duty cycle in a clocked amplifier mode, for example, a duty cycle of 50:50 for generating a known and precisely defined output current. The calibration measurements and the calibration values determined therewith serve primarily for minimizing error influences caused by, for example, component tolerances, temperature effects or external influences such as, for example, the supply voltage of the amplifier circuit.

The present invention makes it possible to reduce component and circuitry complexity of measuring the output current of an amplifier circuit operated in a clocked manner, which is particularly advantageous in certain fields of application, such as the aerospace sector, because no components are required which are critical for different reasons with regard to some fields of application, such as, for example, analog-to-digital converters or multiplexers. The amount of components required for the measurement is reduced by the invention to a few capacitive elements and a simple current-determining circuit which, in particular, comprises few comparators.

Figure 7:
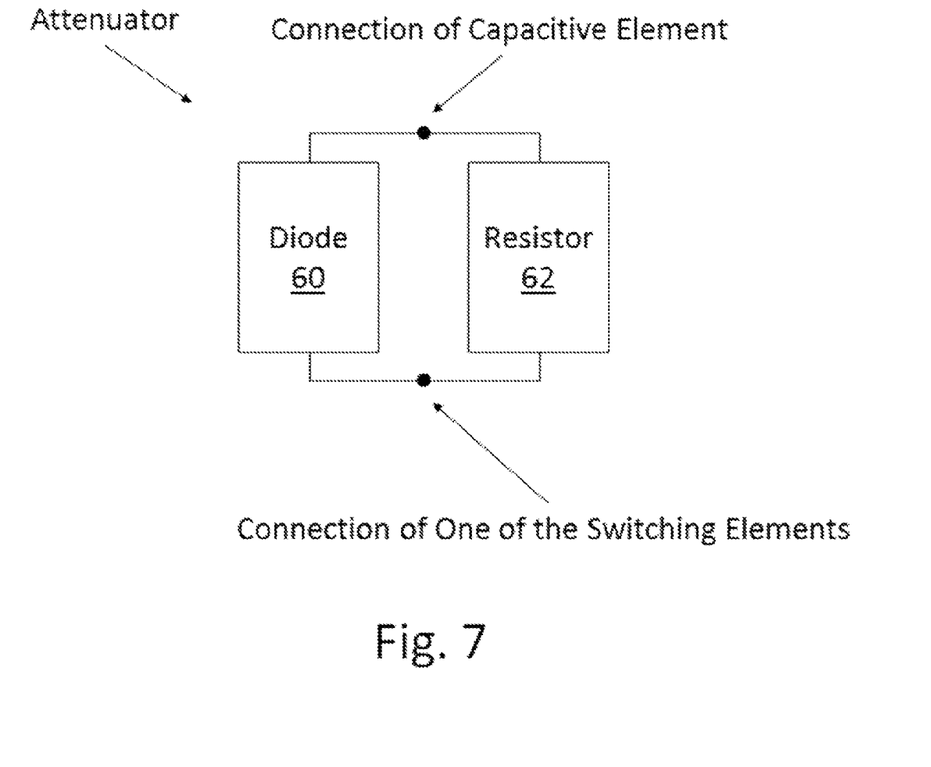
FIG. 7 schematically shows an attenuator for limiting current.

Finally, the at least one capacitive element can comprise an attenuator for limiting current. For example, as illustrated in FIG. 7 the attenuator comprises a parallel connection of a diode 60 and a resistor 62 and is connected between a connection of the capacitive element and a connection of one of the switching elements. The attenuator can avoid damage to the at least one capacitive element caused by high currents which can occur during closing of the switching element thereby effecting short-circuiting the capacitive element.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

REFERENCE NUMBERS AND ACRONYMS

10 Class D amplifier circuit
12 P-channel MOSFET
14 N-channel MOSFET
16 Positive potential
18 Negative potential
20 First capacitor
22 Second capacitor
24 LC low-pass filter
25 Input voltage of the LC low-pass filter 24
26 Measuring circuit
28 Current-determining circuit
30 Measured value of output current
32 Amplifier output
34 Time-to-digital converter
36 Start signal
38 First threshold voltage
40 Stop signal
42 Second threshold voltage
44 Calibration values
A Switching signal of the P-channel MOSFET 12
B Switching signal of the N-channel MOSFET 14

What is claimed is:

1. An amplifier circuit, comprising:
a first and a second switching element, which are connected in series between a first and a second voltage potential and are configured to be actuated in an amplifier mode in a clocked manner, wherein a capacitive element is connected in parallel to at least one of the first and second switching elements,
a measuring circuit configured to measure switching edges occurring during switching of the switching elements; and
a current-determining circuit configured to determine an output current based on the measured switching edges,
wherein the measuring circuit has a time-to-digital converter configured to measure a time period of a change of a voltage at the midpoint of a series connection of the first and second switching elements, wherein the time period of change occurs during switching of at least one of the first and second switching elements.

2. The amplifier circuit according to claim 1, wherein the measuring circuit is configured to generate a start signal for the measuring process carried out by the time-to-digital-converter when the voltage at the midpoint of the series connection of the two switching elements exceeds or falls below a first threshold voltage, and to generate a stop signal for the measuring process carried out by the time-to-digital-converter when the voltage at the midpoint of the series connection of the two switching elements exceeds or falls below a second threshold voltage.

3. The amplifier circuit according to claim 2, wherein the first and the second threshold voltage are selected so as to be almost identical such that they lie approximately in the middle of the supply voltage range of the amplifier circuit.

4. The amplifier circuit according to claim 3, wherein the measuring circuit comprises one or a plurality of comparators configured to detect when the voltage at the midpoint of the series connection of the first and second switching elements exceeds or falls below the first or the second threshold voltage, and configured to generate the start or stop signal for the time-to-digital converter.

5. The amplifier circuit according to claim 3 wherein the time-to-digital converter is implemented through a field programmable gate array (FPGA), an application specific integrated circuit (ASIC) or a special time-to-digital converter module.

6. The amplifier circuit according to claim 1, wherein the current-determining circuit is configured to determine the output current using the measured time period of the change of the voltage at the midpoint of the series connection of the two switching elements, wherein said change occurs during switching of at least one of the two switching elements, and by means of the known value of the at least one capacitive element.

7. The amplifier circuit according to claim 6, wherein the current-determining circuit is configured to determine, based on a time period measured for a positive switching edge and based on a time period measured for a negative switching edge, a positive or negative output current, respectively.

8. The amplifier circuit according to claim 7, wherein the current-determining circuit is configured to determine the difference between the time period measured for a positive switching edge and the time period measured for a negative switching edge and, based on the determined difference, to carry out a calibration of the measured switching edges.

9. The amplifier circuit according to claim 1, wherein the current-determining circuit is configured to consider calibration values when determining the output current using the measured switching edges, said calibration values having been determined under known operating conditions of the amplifier circuit that include a clocked amplifier mode with a duty cycle of 50:50 for generating a known output current.

10. The amplifier circuit according to claim 1, wherein the first and second voltage potentials are approximately identical with regard to an absolute value and have different polarities.

11. The amplifier circuit according to claim 1, wherein the first switching element is a P-channel MOSFET and the second switching element is an N-channel MOSFET.

12. The amplifier circuit according to claim 1, wherein said circuit is part of a class D amplifier circuit and the first and second switching elements are actuated with a pulse-width-modulated signal.

13. The amplifier circuit according to claim 1, wherein the capacitive element has an attenuator configured to limit current, wherein the attenuator comprises a parallel connection of a diode and a resistor and is connected between a connection of the capacitive element and a connection of one of the switching elements.

* * * * *